(12) United States Patent
Sakai et al.

(10) Patent No.: US 11,920,012 B2
(45) Date of Patent: Mar. 5, 2024

(54) RELEASE FILM AND METHOD OF MANUFACTURING RELEASE FILM

(71) Applicant: KOBAYASHI & CO., LTD., Tokyo (JP)

(72) Inventors: Keisuke Sakai, Matsudo (JP); Norifumi Iwawaki, Matsudo (JP); Nanae Tanaka, Matsudo (JP); Satoshi Hiramatsu, Matsudo (JP); Akane Kawafuchi, Matsudo (JP)

(73) Assignee: KOBAYASHI & CO., LTD., Tokyo (JP)

( * ) Notice: Subject to any disclaimer, the term of this patent is extended or adjusted under 35 U.S.C. 154(b) by 643 days.

(21) Appl. No.: 17/251,109

(22) PCT Filed: Apr. 8, 2019

(86) PCT No.: PCT/JP2019/015353
§ 371 (c)(1),
(2) Date: Dec. 10, 2020

(87) PCT Pub. No.: WO2019/244448
PCT Pub. Date: Dec. 26, 2019

(65) Prior Publication Data
US 2021/0253815 A1    Aug. 19, 2021

(30) Foreign Application Priority Data

Jun. 22, 2018   (JP) .................................. 2018-119270

(51) Int. Cl.
*C08J 7/04*      (2020.01)
*B29C 33/68*   (2006.01)
(Continued)

(52) U.S. Cl.
CPC ............... *C08J 7/042* (2013.01); *B29C 33/68* (2013.01); *B32B 27/36* (2013.01); *H01L 21/566* (2013.01);
(Continued)

(58) Field of Classification Search
None
See application file for complete search history.

(56) References Cited

U.S. PATENT DOCUMENTS

| 2014/0363667 | A1 | 12/2014 | Yasui et al. ..................... 428/352 |
| 2016/0368176 | A1* | 12/2016 | Kasai ......................... B32B 7/06 |
| 2020/0407136 | A1* | 12/2020 | Kishimoto ............. C08J 7/0427 |

FOREIGN PATENT DOCUMENTS

| CN | 107225831 A | 10/2017 |
| EP | 1612021 A1 | 1/2006 |

(Continued)

OTHER PUBLICATIONS

International Search Report dated Jun. 11, 2019, issued to PCT/JP2019/015353.
(Continued)

*Primary Examiner* — Jeffrey D Washville
(74) *Attorney, Agent, or Firm* — Stein IP, LLC (57) ABSTRACT

To provide a release film not to contaminate a mold or a molded article. The present invention provides a release film comprising, an oligomer bleeding prevention layer formed of an acrylic resin or a siloxane resin and laminated on a first face of a base layer that is formed of a polyethylene terephthalate resin; a surface layer formed of a fluororesin and laminated on the oligomer bleeding prevention layer; and a surface layer formed of a fluororesin and laminated on a second face of the base layer, or an oligomer bleeding prevention layer formed of an acrylic resin or a siloxane resin and laminated on a second face of the base layer, and
(Continued)

a surface layer formed of a fluororesin and laminated on the oligomer bleeding prevention layer that is laminated on the second face.

10 Claims, 6 Drawing Sheets

(51) Int. Cl.
*B32B 27/36* (2006.01)
*H01L 21/56* (2006.01)
*H01L 23/29* (2006.01)

(52) U.S. Cl.
CPC ...... *H01L 23/293* (2013.01); *H01L 2924/181* (2013.01)

(56) References Cited

FOREIGN PATENT DOCUMENTS

| | | |
|---|---|---|
| JP | 2000-227503 A | 8/2000 |
| JP | 2001-129940 A | 5/2001 |
| JP | 2003-261702 A | 9/2003 |
| JP | 2004-122669 A | 4/2004 |
| JP | 2006-028378 A | 2/2006 |
| JP | 2006-049850 A | 2/2006 |
| JP | 2007-237714 A | 9/2007 |
| JP | 2011-218588 A | 11/2011 |
| JP | 2015-074201 A | 4/2015 |
| JP | 2017-100397 A | 6/2017 |
| JP | 2017-113923 A | 6/2017 |
| JP | 2017-126455 A | 7/2017 |
| JP | 2017-177679 A | 10/2017 |
| TW | 201817603 A | 5/2018 |
| TW | 201819141 A | 6/2018 |
| WO | WO 2008/020543 A1 | 2/2008 |
| WO | WO 2015/133631 A1 | 9/2015 |

OTHER PUBLICATIONS

Notice of Reasons for Refusal dated May 31, 2019, issued to Japanese Patent Application No. 2019-519349.

Decision of Refusal dated Jul. 17, 2019, issued to Japanese Patent Application No. 2019-519349.

Chinese Office Action dated Mar. 20, 2623, issued by the China National Intellectual Property Administration in corresponding application CN 291980041248.3.

Singaporean Search Report and Written Opinion dated Oct. 11, 2021, issued by the Intellectual Property Office of Singapore in corresponding application SG 11202012850X.

* cited by examiner

0 PIECE

RELEASE FILM AND METHOD OF MANUFACTURING RELEASE FILM

CROSS-REFERENCE TO RELATED APPLICATIONS

This application is a national stage of International Application No. PCT/JP20191015353, filed Apr. 8, 2019 which claims the benefit of Japanese Application No. 2018-119270, filed Jun. 22, 2018, in the Japanese Patent Office, the disclosures of which are incorporated herein by reference.

TECHNICAL FIELD

The present invention relates to a release film and a method of manufacturing the film, and more specifically relates to a release film used for transfer molding or compression molding and a method of manufacturing the film.

BACKGROUND ART

In order to seal a semiconductor with a resin, a molding technique such as transfer molding and compression molding is used. In the molding technique, a release film is often used to facilitate the release of a molded article from a mold after a resin is cured in the mold, and various release films have been developed.

For example, Patent Document 1 discloses a release film that includes a coated film including a composition containing a fluorine resin (A) having a functional group X and a release component (B) and includes a layer including a non-fluorinated polymer.

Patent Document 2 discloses a gas-barrier release film for semiconductor resin molding. The release film at least includes a release layer (I) having excellent mold release properties and a plastic support layer (II) supporting the release layer. The plastic support layer (II) has a strength of 1 MPa to 50 MPa at 200% elongation at 170° C., and the release film has a xylene gas permeability of $5 \times 10^{-15}$ (kmol·m/(s·m²·kPa)) at 170° C.

CITATION LIST

Patent Documents

Patent Document 1: JP-A No. 2015-74201
Patent Document 2: WO2008/020543

SUMMARY OF THE INVENTION

Technical Problem

The release film is used to facilitate the release of a molded article from a mold, as described above. It is desirable that the release film be easily released from a molded article after resin curing.

When a release film is subjected to a high temperature in a mold, a component contained in the release film may move to the surface of the release film, and the component that moves to the surface may contaminate the mold or a molded article. When such contamination occurs, the component is required to be removed from a mold or a molded article. In addition, the component is often difficult to remove. Hence, it is desirable that no contamination of a mold or a molded article with the component occur.

A release film not only usable in molding once but also repeatedly usable in molding multiple times can reduce molding costs. In order to repeatedly use a release film in molding multiple times, the release film is required to maintain its properties through multiple molding operations.

In view of the above circumstances, the present invention is intended to provide a release film that does not contaminate a mold or a molded article. The present invention is also intended to provide a release film that does not contaminate a mold or a molded article and can be repeatedly used in multiple molding processes.

Solution to Problem

The inventors of the present invention have found that a release film having a specific configuration has excellent mold release properties and low contamination properties and also can be used in molding multiple times.

The present invention provides a release film comprising,
an oligomer bleeding prevention layer formed of an acrylic resin or a siloxane resin and laminated on a first face of a base layer that is formed of a polyethylene terephthalate resin;
a surface layer formed of a fluororesin and laminated on the oligomer bleeding prevention layer; and
a surface layer formed of a fluororesin and laminated on a second face of the base layer, or
an oligomer bleeding prevention layer formed of an acrylic resin or a siloxane resin and laminated on a second face of the base layer, and a surface layer formed of a fluororesin and laminated on the oligomer bleeding prevention layer that is laminated on the second face.

The oligomer bleeding prevention layer on the first face may comprise an acrylic resin.

The release film may have a tensile breaking strength of 40 MPa to 200 MPa as determined at 175° C. in accordance with JIS K7127, and the release film may have a tensile elongation at break of 200% to 500% as determined at 175° C. in accordance with JIS K7127.

The release film may have an oxygen gas permeability of 5,000 to cc/m²·0.24 hr·atm as determined at 175° C. in accordance with JIS K7126-1.

The base layer may have a tensile breaking strength of 40 MPa to 200 MPa as determined at 175° C. in accordance with JIS K7127.

The base layer may have a tensile elongation at break of 200% to 500% as determined at 175° C. in accordance with JIS K7127.

The fluororesin that forms the surface layer on at least one face of the base layer may comprise an isocyanate curing agent.

The fluororesin that forms the surface layer on at least one face of the base layer may comprise particles having an average particle size of 1 μm to 10 μm determined by laser diffraction particle size analysis.

The fluororesin that forms the surface layer may comprise a tetrafluoroethylene resin.

The release film may be used for transfer molding or compression molding.

The release film may be used for molding two or more times.

The present technique also provides a method of manufacturing a release film. The method comprises a first applying step of applying an acrylic resin composition or a siloxane resin composition onto one face of a base layer formed of a polyethylene terephthalate resin, a first curing step of curing the resin composition applied in the first applying step to give an oligomer bleeding prevention layer, after the first curing step, a second applying step of applying a fluororesin composition onto the oligomer bleeding prevention layer and an other face of the base layer, and after the second applying step, a second curing step of curing the fluororesin composition to give surface layers.

The present technique also provides a method of manufacturing a release film. The method comprises a first applying step of applying an acrylic resin composition or a siloxane resin composition onto both faces of a base layer formed of a polyethylene terephthalate resin, a first curing step of curing the resin composition applied in the first applying step to give two oligomer bleeding prevention layers, after the first curing step, a second applying step of applying a fluororesin composition onto the two oligomer bleeding prevention layers, and after the second applying step, a second curing step of curing the fluororesin composition to give surface layers.

Advantageous Effects of Invention

According to the present invention, a release film having excellent mold release properties and low contamination properties and repeatedly usable for molding multiple times is provided.

The effect of the invention is not necessarily limited to that described in this paragraph and may be any of the effect described in the present description.

DESCRIPTION OF EMBODIMENTS

Embodiments for carrying out the present invention will now be described in detail. Embodiments described below are merely examples of typical embodiments of the present invention, and the present invention is not limited to these embodiments.

A release film (mold-release film) of the present invention comprises a base layer formed of a polyethylene terephthalate resin composition and two surface layers formed of a fluororesin, and between the base layer and one or both of the two surface layers, an oligomer bleeding prevention layer formed of an acrylic resin or a siloxane resin is interposed.

Figure 1A:
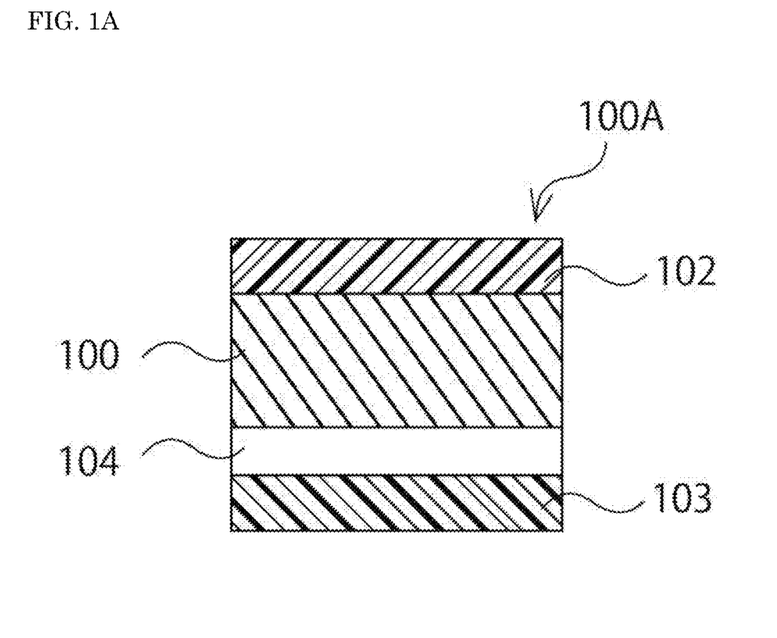
FIG. 1A is a view showing an example structure of a release film of the present invention.

An example structure of the release film of the present invention is shown in FIG. 1A. As shown in FIG. 1A, a release film 100A of the present invention comprises a base layer 101 and two surface layers 102 and 103, and an oligomer bleeding prevention layer 104 is interposed between the surface layer 102 and the base layer 101.

The base layer 101 is formed of a polyethylene terephthalate resin. The two surface layers 102 and 103 are formed of a fluororesin. The two surface layers 102 and 103 may be formed of the same fluororesin or may be formed of different fluororesins. The oligomer bleeding prevention layer 104 is formed of an acrylic resin or a siloxane resin.

Figure 1B:
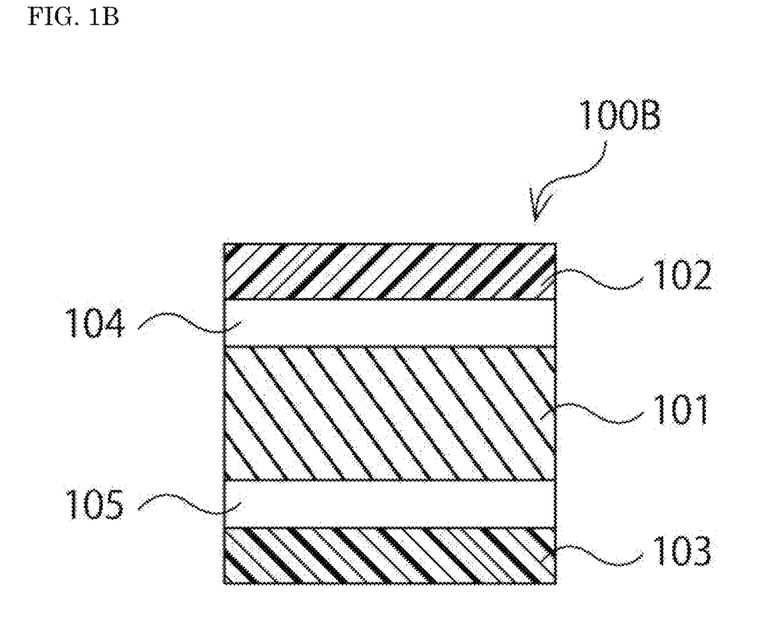
FIG. 1B is a view showing an example structure of a release film of the present invention.

Another structure example of the release film of the present invention is shown in FIG. 1B. As shown in FIG. 1B, a release film 100B of the present invention comprises a base layer 101 and two surface layers 102 and 103, and oligomer bleeding prevention layers 104 and 105 are interposed between the surface layer 102 and the base layer 101 and between the surface layer 103 and the base layer 101, respectively.

The base layer 101 is formed of a polyethylene terephthalate resin. The two surface layers 102 and 103 are formed of a fluororesin. The two surface layers 102 and 103 may be formed of the same fluororesin or may be formed of different fluororesins. The oligomer bleeding prevention layers 104 and 105 are formed of an acrylic resin or a siloxane resin. The oligomer bleeding prevention layers 104 and 105 may be formed of the same resin or may be formed of different resins.

The release film of the present invention has a configuration in which an oligomer bleeding prevention layer and a surface layer are laminated on at least one face of a base layer, thus has excellent mold release properties, can prevent a substance contained in the base layer from contaminating a mold (metal mold) or a molded article, and can be used for carrying out a molding process multiple times. Effects achieved by the release film of the present invention will now be described in more detail.

A polyethylene terephthalate resin contains oligomers produced in production thereof and having low polymerization degrees. When a release film comprising a layer formed of such a polyethylene terephthalate resin is used to perform molding, the oligomer may move to the surface of the release film and may contaminate a molded article and/or the surface of a mold. The contamination may be caused even when, for example, a fluorine resin layer is laminated on the surface of the polyethylene terephthalate resin layer. This is thought to be because the oligomer passes through the fluorine resin layer. The contamination is likely to be caused particularly when a single release film is used in carrying out a molding process multiple times. This is supposed to be because application of heat to the polyethylene terephthalate resin during molding causes the oligomer to move from the inside of the resin to the surface.

The release film of the present invention has a configuration in which the oligomer bleeding prevention layer and the surface layer are laminated on at least one face of the base layer formed of a polyethylene terephthalate resin. Lamination of these two layers on the base layer reduces or prevents the contamination of a molded article and/or a mold by the oligomer. Moreover, the release film of the present invention maintains the low contamination properties through multiple molding operations.

A typical release film is replaced with a fresh film every molding operation. This is because when a release film once used in a molding operation is used in another molding operation, the release film is highly probably broken. Breaking a release film is fatal to molding and can result in an abnormal shape of a molded article or can result in adhesion between a mold and a molded article, for example.

The release film according to the present invention has a three-layer structure in which an oligomer bleeding prevention layer and a surface layer are laminated on a base layer. The release film according to the present invention is unlikely to break and maintains its mold release properties and low contamination properties due to the three-layer structure even when used for molding multiple times. Hence, the release film according to the present invention can be used for molding multiple times, and this reduces molding costs.

The release film of the present invention will be described in more detail hereinafter.

[Base Layer]

The base layer included in the release film of the present invention is formed of a polyethylene terephthalate resin. The polyethylene terephthalate resin (also referred to as PET resin) may be a conventional polyethylene terephthalate resin.

The glass transition temperature of the polyethylene terephthalate resin may, for example, be 100° C. or more and particularly 100° C. to 150° C. The glass transition temperature is determined by differential thermal analysis (DTA).

Examples of the film formed of a polyethylene terephthalate resin include, but are not limited to, a film in a Tetoron (registered trademark) series.

The tensile breaking strength of the base layer, as determined at 175° C. in accordance with JIS K7127, may preferably be 40 MPa to 200 MPa, more preferably 40 MPa to 120 MPa, even more preferably 40 MPa to 110 MPa, and particularly preferably 45 MPa to 100 MPa.

The tensile elongation at break of the base layer, as determined at 175° C. in accordance with JIS K7127, may preferably be 200% to 500%, more preferably 250% to 450%, and even more preferably 300% to 400%.

The base layer having such physical properties contributes to making the release film of the present invention usable in molding multiple times.

The thickness of the base layer may, for example, be 10 µm to 80 µm, preferably 15 µm to 75 µm, and more preferably 20 µm to 70 µm. The thickness contributes to making the release film of the present invention usable in molding multiple times.

[Oligomer Bleeding Prevention Layer]

The oligomer bleeding prevention layer is formed of an acrylic resin or a siloxane resin. The oligomer bleeding prevention layer can prevent an oligomer from the base layer from moving to the surface of the release film. The release film of the present invention has a configuration in which the oligomer bleeding prevention layer and the surface layer are laminated on the base layer and thus can prevent the contamination by an oligomer through multiple molding operations. The oligomer bleeding prevention layer formed of an acrylic resin or a siloxane resin functions as a primer, and this improves the adhesion of the base layer, the oligomer bleeding prevention layer, and the surface layer at high temperatures. An oligomer bleeding prevention layer formed of a siloxane resin can also prevent electrification of the release film.

The acrylic resin and the siloxane resin that form the oligomer bleeding prevention layer may be a resin known in the art or may be a commercially available resin. Examples of the acrylic resin and the siloxane resin will next be described.

The acrylic resin that forms the oligomer bleeding prevention layer may preferably be a cured product of a thermosetting acrylic resin composition. The cured product may preferably be a cured product by an isocyanate curing system, an amine curing system, or an epoxy curing system and is more preferably a cured product by an isocyanate curing system. By adopting the isocyanate curing system, the thermosetting acrylic resin composition is cured more rapidly. By adopting the isocyanate curing system, high heat resistance and flexibility can be imparted to a cured film, and thus an oligomer bleeding prevention layer suitable for multiple molding operations is formed. The thermosetting acrylic resin composition may be cured by heating, for example, at 100 to 200° C., preferably at 120° C. to 180° C., for example, for 20 seconds to 5 minutes, preferably for 30 seconds to 2 minutes.

As the thermosetting acrylic resin composition, for example, an ARACOAT DA series (Arakawa Chemical Industries, Ltd.) may be used. For example, a combination of ARACOAT DA105 (main agent) and ARACOAT CL10211 (curing agent) (isocyanate curing system) or a combination of ARACOAT DA201N (main agent) and ARACOAT CL201 (curing agent) (amine curing system) may be used to give the thermosetting acrylic resin composition, and a combination of ARACOAT DA105 (main agent) and ARACOAT CL102H (curing agent) is preferably used. The main agent and the curing agent may be mixed at a predetermined ratio before application and then may be applied onto a base layer. As the ratio, a ratio recommended by a manufacturer of the products may be used, for example. After application on a base layer, a cured product is formed by heating, for example, at 100 to 200° C., preferably at 120° C. to 180° C., for example, for 20 seconds to 5 minutes, preferably for 30 seconds to 2 minutes.

The thermosetting acrylic resin composition may contain a hydroxy group-containing acrylic copolymer and polyisocyanate, for example.

The hydroxy group-containing acrylic copolymer may be a copolymer formed of a monomer component A and a monomer component B shown below or a copolymer formed of a monomer component A, a monomer component B, and a monomer component C shown below.

Monomer component A: one, two, or three of alkyl (meth)acrylates, α-olefins, and styrene compounds Monomer component B: one or two of hydroxy(meth)acrylates and unsaturated alcohols Monomer component C: an unsaturated carboxylic acid Examples of the alkyl (meth)acrylate as the monomer component A include methyl (meth)acrylate, ethyl (meth)acrylate, n-butyl (meth)acrylate, isobutyl (meth)acrylate, sec-butyl (meth)acrylate, tert-butyl (meth)acrylate, octyl (meth)acrylate, 2-ethylhexyl (meth)acrylate, hexadecyl (meth)acrylate, dodecyl (meth)acrylate, octadecyl (meth)acrylate, icosyl (meth)acrylate, docosyl (meth)acrylate, cyclopentyl (meth)acrylate, cyclohexyl (meth)acrylate, cyclopentanyl (meth)acrylate, isobornyl (meth)acrylate, phenyl (meth)acrylate, benzyl (meth)acrylate, and 4-methylbenzyl (meth)acrylate.

Examples of the α-olefin as the monomer component A include 2,4,4-trimethyl-1-pentene, 3-methyl-1-butene, 3-methyl-1-pentene, 1-hexene, vinylcyclohexane, and 2-methylvinylcyclohexane.

Examples of the styrene compound as the monomer component A include styrene, α-methylstyrene, and t-butylstyrene.

Examples of the hydroxy(meth)acrylate as the monomer component B include hydroxymethyl (meth)acrylate, hydroxyethyl (meth)acrylate, 2-hydroxypropyl (meth)acrylate, 2-hydroxybutyl (meth)acrylate, 3-hydroxybutyl (meth)acrylate, 4-hydroxybutyl (meth)acrylate, hydroxycyclohexyl (meth)acrylate, 4-(hydroxymethyl)cyclohexylmethyl (meth)acrylate, 4-(hydroxymethyl)cyclohexylmethyl 2-hydroxypropionate, hydroxyphenyl (meth)acrylate, N-(2-hydroxyethyl)acrylamide, and N-(1-methyl-2-hydroxyethyl) acrylamide.

Examples of the unsaturated alcohol as the monomer component B include (meth)allyl alcohol, 4-penten-1-ol, 1-methyl-3-buten-1-ol, and Examples of the unsaturated carboxylic acid as the monomer component C include (meth)acrylic acid, 3-butenoic acid, 4-pentenoic acid, and 5-hexenoic acid.

In order to form a layer preventing an oligomer from moving to the surface of a film, one or more compounds selected from methyl (meth)acrylate, ethyl (meth)acrylate, n-butyl (meth)acrylate, isobutyl (meth)acrylate, sec-butyl (meth)acrylate, and tert-butyl (meth)acrylate are preferably used as the monomer component A, one or more compounds selected from hydroxymethyl (meth)acrylate, hydroxyethyl (meth)acrylate, and 2-hydroxypropyl (meth)acrylate are preferably used as the monomer component B, and (meth) acrylic acid is preferably used as the monomer component C.

The hydroxy group-containing acrylic copolymer may be produced by a method known in the art, and, for example, may be produced by copolymerization reaction without solvent or in an organic solvent in the presence of a known radical polymerization initiator.

In order to form a layer preventing an oligomer from moving to the surface of a film, the amounts of the monomer components A, B, and C used in the copolymerization reaction may preferably be about 40 to 97% by mole, about 3 to 60% by mole, and 0 to 40% by mole, respectively, and more preferably 45 to 80% by mole, 15 to 55% by mole, and 2 to 5% by mole, respectively.

The polyisocyanate is preferably a compound having three or more isocyanate groups per molecule. The polyisocyanate may preferably be an isocyanurate-type polyisocyanate and/or an adduct-type polyisocyanate. As the polyisocyanate, for example, an isocyanurate-type or adduct-type polyisocyanate of an aromatic diisocyanate, an isocyanurate-type or adduct-type polyisocyanate of an aliphatic diisocyanate, or an isocyanurate-type or adduct-type polyisocyanate of an alicyclic diisocyanate may be used.

As the aromatic diisocyanate, tolylene diisocyanate, diphenylmethane diisocyanate, or xylylene diisocyanate may be used.

As the aliphatic diisocyanate, hexamethylene diisocyanate, trimethylhexamethylene diisocyanate, or lysine diisocyanate may be used.

As the alicyclic diisocyanate, dicyclohexylmethane diisocyanate, isophorone diisocyanate, 1,4-cyclohexane diisocyanate, hydrogenated xylene diisocyanate, or hydrogenated tolylene diisocyanate may be used.

As the polyisocyanate, a modified polyisocyanate as a reaction product of the isocyanurate-type polyisocyanate and/or the adduct-type polyisocyanate with a diol compound, a diamine compound, or water may be used. The diol compound is preferably a diol compound having 4 to 8 carbon atoms. The diamine compound is preferably an aminone compound having 2 to 20 carbon atoms.

The siloxane resin that forms the oligomer bleeding prevention layer may preferably be a cured product of a thermosetting siloxane resin composition. The cured product preferably contains a hydroxy group-containing siloxane skeleton. The thermosetting siloxane resin composition may be cured by heating, for example, at 100° C. to 200° C., preferably at 120° C. to 180° C., for example, for 20 seconds to 5 minutes, preferably for 30 seconds to 2 minutes.

As the thermosetting siloxane resin composition to form a cured product containing a hydroxy group-containing siloxane skeleton, for example, Colcoat N-103X and Colcoat PX (COLCOAT Co., Ltd.) may be used. By applying a thermosetting siloxane resin composition onto a base layer, a vitreous film having high smoothness and having a hydroxy group-containing siloxane skeleton is formed. Such a film is thought to be suitable to prevent a PET-derived oligomer from bleeding.

The thermosetting siloxane resin composition may contain an alkoxysilane compound and/or a partial hydrolysate thereof, for example.

Examples of the alkoxysilane compound include a compound having four alkoxy groups, a compound having three alkoxy groups, and a compound having two alkoxy groups.

Examples of the alkoxysilane compound having four alkoxy groups include tetramethoxysilane, tetraethoxysilane, tetra-n-propoxysilane, tetra-n-butoxysilane, and tetraacetoxysilane.

Examples of the alkoxysilane compound having three alkoxy groups include methyltrimethoxysilane, methyltriethoxysilane, ethyltrimethoxysilane, ethyltriethoxysilane, n-propyltrimethoxysilane, n-propyltriethoxysilane, i-propyltrimethoxysilane, i-propyltriethoxysilane, γ-chloropropyltrimethoxysilane, γ-chloropropyltriethoxysilane, γ-glycidoxypropyltrimethoxysilane, γ-glycidoxypropyltriethoxysilane, γ-methacryloyloxypropyltrimethoxysilane, γ-mercaptopropyltriethoxysilane, phenyltrimethoxysilane, vinyltriethoxysilane, 3,4-epoxycyclohexylethyltrimethoxysilane, and 3,4-epoxycyclohexylethyltriethoxysilane.

Examples of the alkoxysilane compound having two alkoxy groups include dimethyldimethoxysilane, dimethyldiethoxysilane, methylphenyldimethoxysilane, diethyldimethoxysilane, diethyldiethoxysilane, di-n-propyldimethoxysilane, di-n-propyldiethoxysilane, di-i-propyldimethoxysilane, di-i-propyldiethoxysilane, diphenyldimethoxysilane, and divinyldiethoxysilane.

Preferably, the thermosetting siloxane resin composition contains a tetraalkoxysilane and/or a partial hydrolysate of a tetraalkoxysilane. The thermosetting siloxane resin composition may contain a polysiloxane having a silanol group. These components are condensed by heating, and a film (oligomer bleeding prevention layer) having a hydroxy group-containing siloxane skeleton as a main constituent element is formed on a face of a base layer.

The thickness of the oligomer bleeding prevention layer may, for example, be 0.01 μm to 10 μm, preferably 0.05 to 5 μm, and more preferably 0.1 μm to 3 μm. The oligomer bleeding prevention layer including an acrylic resin or a siloxane resin may be such a thin layer as above. This can reduce the production cost of a release film. In addition, the resin composition is rapidly cured, and the layer is formed for a short time.

[Surface Layer]

The two surface layers included in the release film of the present invention are formed of a fluororesin. According to a preferred embodiment of the present invention, the fluororesin contains no chlorine. Containing no chlorine improves the durability and/or the antifouling properties of the layers. The fluororesin may, for example, be a cured product of a fluororesin composition containing a reactive functional group-containing fluoropolymer and a curing agent.

The fluororesin preferably contains a tetrafluoroethylene resin and more preferably contains a tetrafluoroethylene resin as a main component. In the present description, the tetrafluoroethylene resin is a component produced by curing reaction of a reactive functional group-containing tetrafluoroethylene polymer described below with a curing agent. A tetrafluoroethylene resin being a main component means that the fluororesin is composed of a tetrafluoroethylene resin or the content of a tetrafluoroethylene resin is the highest among the components of the fluororesin. For example, the content of a tetrafluoroethylene resin in the fluororesin may, for example, be 70% by mass or more, preferably 75% by mass or more, more preferably 80% by mass or more, and particularly preferably 85% by mass or more, relative to the total mass of the fluororesin. The content may, for example, be 99% by mass or less, particularly 98% by mass or less, and more particularly 97% by mass or less, relative to the total mass of the fluororesin.

The reactive functional group-containing fluoropolymer contained in the fluororesin composition may be a fluoropolymer that is curable by the curing agent. The reactive functional group and the curing agent may appropriately be selected by a person skilled in the art.

The reactive functional group may, for example, be a hydroxy group, a carboxyl group, the group represented by —COOCO—, an amino group, or a silyl group and is preferably a hydroxy group. Such a group allows a reaction for giving the cured product to satisfactory proceed.

Of these reactive functional groups, a hydroxy group is particularly suitable to the reaction for giving the cured product. In other words, the reactive functional group-containing fluoropolymer may preferably be a hydroxy group-containing fluoropolymer and more preferably a hydroxy group-containing tetrafluoroethylene polymer.

The fluorine-containing unit of the reactive functional group-containing fluoropolymer is preferably a fluorine-containing unit based on a perfluoroolefin. The fluorine-containing unit based on the perfluoroolefin may more preferably be based on one, two, or three selected from tetrafluoroethylene (tetrafluoroethylene, also referred to as "TFE" in the present description), hexafluoropropylene (HFP), and perfluoro(alkyl vinyl ethers) (PAVEs). Preferably, of the fluorine-containing units based on the perfluoroolefin, the amount of a fluorine-containing unit based on TFE is the largest.

The hydroxy value of the reactive functional group-containing fluoropolymer (particularly the hydroxy value of the hydroxy group-containing fluoropolymer) may preferably be 10 mg KOH/g to 300 mg KOH/g, more preferably 10 mg KOH/g to 200 mg KOH/g, and even more preferably 10 mg KOH/g to 150 mg KOH/g. The reactive functional group-containing fluoropolymer having a hydroxy value not less than the lower limit of the above numerical range may make the resin composition have good curing properties. The reactive functional group-containing fluoropolymer having a hydroxy value not more than the upper limit of the above numerical range may contribute to making the resin composition give a cured product suitable for multiple molding operations. The hydroxy value is determined by a method in accordance with JIS K 0070.

The acid value of the reactive functional group-containing fluoropolymer (particularly the acid value of the hydroxy group-containing fluoropolymer) may preferably be 0.5 mg KOH/g to 100 mg KOH/g and more preferably 0.5 mg KOH/g to 50 mg KOH/g. The reactive functional group-containing fluoropolymer having an acid value not less than the lower limit of the above numerical range may make the resin composition have good curing properties. The reactive functional group-containing fluoropolymer having an acid value not more than the upper limit of the above numerical range may contribute to making the resin composition give a cured product suitable for multiple molding operations.

The reactive functional group of the reactive functional group-containing fluoropolymer may be introduced into the fluoropolymer by copolymerization of a monomer having the reactive functional group with a fluorine-containing monomer (particularly the above perfluoroolefin). In other words, the reactive functional group-containing fluoropolymer may contain a polymer unit based on a reactive functional group-containing monomer and a polymer unit based on a fluorine-containing monomer (particularly the above perfluoroolefin).

When the reactive functional group is a hydroxy group, the monomer having the reactive functional group may preferably be a hydroxy group-containing vinyl ether or a hydroxy group-containing allyl ether. Examples of the hydroxy group-containing vinyl ether include 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether, and 6-hydroxyhexyl vinyl ether, and examples of the hydroxy group-containing hydroxy group-containing allyl ether include 2-hydroxyethyl allyl ether, 4-hydroxybutyl allyl ether, and glycerol monoallyl ether. Alternatively, the monomer having the reactive functional group may, for example, be a hydroxyalkyl ester of (meth)acrylic acid such as 2-hydroxyethyl acrylate and 2-hydroxyethyl methacrylate. As the monomer having the reactive functional group, these compounds may be used singly or in combination of two or more of them. When the reactive functional group is a hydroxy group, the monomer having the reactive functional group may more preferably be a hydroxy group-containing vinyl ether and specifically preferably 4-hydroxybutyl vinyl ether and/or 2-hydroxyethyl vinyl ether from the viewpoint of curing properties of the resin composition.

When the reactive functional group is a carboxyl group, the monomer having the reactive functional group may preferably be an unsaturated carboxylic acid, an ester of an unsaturated carboxylic acid, or an acid anhydride of an unsaturated carboxylic acid.

When the reactive functional group is an amino group, the monomer having the reactive functional group may, for example, be an amino vinyl ether or allylamine.

When the reactive functional group is a silyl group, the monomer having the reactive functional group may preferably be a silicone vinyl monomer.

The fluorine-containing monomer is preferably a perfluoroolefin. Examples of the perfluoroolefin include tetrafluoroethylene (TFE), hexafluoropropylene (HFP), and perfluoro(alkyl vinyl ethers) (PAVEs). Preferably, the fluorine-containing monomer comprises TFE.

Preferably, the reactive functional group-containing fluoropolymer may contain, in addition to the polymer unit based on a reactive functional group-containing monomer and the polymer unit based on a fluorine-containing monomer, a polymer unit based on a fluorine-free vinyl monomer. The fluorine-free vinyl monomer may, for example, be a single monomer or a combination of two or more monomers selected from vinyl carboxylates, alkyl vinyl ethers, and non-fluorinated olefins.

Examples of the vinyl carboxylate include vinyl acetate, vinyl propionate, vinyl butyrate, vinyl isobutyrate, vinyl pivalate, vinyl caproate, vinyl versatate, vinyl laurate, vinyl stearate, vinyl cyclohexylcarboxylate, vinyl benzoate, and vinyl para-t-butylbenzoate.

Examples of the alkyl vinyl ether include methyl vinyl ether, ethyl vinyl ether, butyl vinyl ether, and cyclohexyl vinyl ether.

Examples of the non-fluorinated olefin include ethylene, propylene, n-butene, and isobutene.

The reactive functional group-containing fluoropolymer may contain, in addition to the polymer unit based on a reactive functional group-containing monomer and the polymer unit based on a fluorine-containing monomer as a perfluoroolefin, a polymer unit based on a fluoromonomer other than the perfluoroolefin, such as vinylidene fluoride (VdF), chlorotrifluoroethylene (CTFE), vinyl fluoride (VF), and fluorovinyl ether.

The reactive functional group-containing fluoropolymer may, for example, be a TFE/non-fluorinated olefin/hydroxybutyl vinyl ether copolymer, a TFE/vinyl carboxylate/hydroxybutyl vinyl ether copolymer, or a TFE/alkyl vinyl ether/hydroxybutyl vinyl ether copolymer.

More specifically, the reactive functional group-containing fluoropolymer may be a TFE/isobutylene/hydroxybutyl vinyl ether copolymer, a TFE/vinyl versatate/hydroxybutyl vinyl ether copolymer, or a TFE/VdF/hydroxybutyl vinyl ether copolymer. The reactive functional group-containing fluoropolymer may particularly preferably be a TFE/isobutylene/hydroxybutyl vinyl ether copolymer or a TFE/vinyl versatate/hydroxybutyl vinyl ether copolymer.

As the reactive functional group-containing fluoropolymer, for example, a product in a Zeffle GK series may be used.

The curing agent contained in the fluororesin composition may appropriately be selected by a person skilled in the art depending on the type of a reactive functional group contained in the reactive functional group-containing fluoropolymer.

When the reactive functional group is a hydroxy group, the curing agent may preferably be a single agent or a combination of two or more agents selected from isocyanate curing agents, melamine resins, silicate compounds, and isocyanate group-containing silane compounds.

When the reactive functional group is a carboxyl group, the curing agent may preferably be a single agent or a combination of two or more agents selected from amino curing agents and epoxy curing agents.

When the reactive functional group is an amino group, the curing agent may be a single agent or a combination of two or more agents selected from carbonyl group-containing curing agents, epoxy curing agents, and acid anhydride curing agents.

The content of the curing agent in the fluororesin composition may, for example, be 15 parts by mass to 50 parts by mass, preferably 20 parts by mass to 40 parts by mass, and more preferably 23 parts by mass to 35 parts by mass relative to 100 parts by mass of the reactive functional group-containing fluoropolymer. These numerical ranges apply also to the content of the curing agent in a cured product of the fluororesin composition.

The content of the curing agent may be determined by pyrolysis gas chromatography (Py-GC/MS).

In an embodiment of the present invention, the reactive functional group contained in the reactive functional group-containing fluoropolymer may be a hydroxy group, and the curing agent may be an isocyanate curing agent. In the embodiment, the isocyanate curing agent is preferably a hexamethylene diisocyanate (HDI) polyisocyanate.

The content of the HDI polyisocyanate in the fluororesin composition may, for example, be 15 parts by mass to 50 parts by mass, preferably 20 parts by mass to 40 parts by mass, and more preferably 23 parts by mass to 35 parts by mass relative to 100 parts by mass of the reactive functional group-containing fluoropolymer. These numerical ranges apply also to the content of the HDI polyisocyanate in a cured product of the fluorine resin composition.

As the HDI polyisocyanate, for example, a single polyisocyanate or a combination of two or more polyisocyanates selected from isocyanurate-type polyisocyanates, adduct-type polyisocyanates, and biuret-type polyisocyanates may be used. In the present invention, the isocyanate curing agent may preferably be an isocyanurate-type polyisocyanate and/or an adduct-type polyisocyanate and more preferably a combination of an isocyanurate-type polyisocyanate and an adduct-type polyisocyanate.

When a combination of an isocyanurate-type polyisocyanate and an adduct-type polyisocyanate is used as the curing agent, the mass ratio thereof is, for example, 10:6 to 10:10 and preferably 10:7 to 10:9. The total amount thereof may, for example, be 15 parts by mass to 50 parts by mass, preferably 20 parts by mass to 40 parts by mass, and more preferably 25 parts by mass to 35 parts by mass relative to 100 parts by mass of the reactive functional group-containing fluoropolymer.

The content ratio of these curing agents may be determined by pyrolysis gas chromatography (Py-GC/MS).

The fluororesin that forms the surface layers contains particles preferably having an average particle size of 1 μm to 10 μm, more preferably 2 μm to 9 μm, as determined by laser diffraction particle size analysis. The average particle size is a volume average diameter weighted by volume and is determined in accordance with JIS Z8825. The average particle size may be determined, for example, with a particle size analyser (SALD-2200, Shimadzu Corporation). The particles can improve mold release properties of the release film.

The particles are preferably inorganic particles or organic particles. Examples of the inorganic particles include particles of silicon dioxide (particularly amorphous silicon dioxide), calcium carbonate, magnesium carbonate, calcium phosphate, kaolin, talc, aluminum oxide, titanium oxide, alumina, barium sulfate, calcium fluoride, lithium fluoride, zeolite, and molybdenum sulfide. Examples of the organic particles include cross-linked polymer particles and calcium oxalate particles. In the present invention, the particles are preferably inorganic particles, more preferably silicon dioxide particles, and even more preferably amorphous silicon dioxide particles. The amorphous silicon dioxide may be a sol-gel type silica. As the amorphous silicon dioxide, for example, an amorphous silicon dioxide in a Sylysia series may be used.

The content of the particles in the fluororesin composition may, for example, be 10 parts by mass to 30 parts by mass, preferably 12 parts by mass to 25 parts by mass, and more preferably 15 parts by mass to 20 parts by mass relative to 100 parts by mass of the reactive functional group-containing fluoropolymer. These numerical ranges apply also to the content of the particles in a cured product of the fluorine resin composition.

The content of the particles may be determined by thermogravimetric analysis (TGA).

The fluororesin composition may contain a solvent. The solvent type may appropriately be selected by a person skilled in the art. Examples of the solvent include butyl acetate, ethyl acetate, and methyl ethyl ketone (also referred to as MEK). For example, a mixture of these three solvents may be used as the solvent.

The fluororesin composition may contain a release accelerator. Examples of the release accelerator include an amino modified-methylpolysiloxane, an epoxy modified-methylpolysiloxane, a carboxy modified-methylpolysiloxane, and a carbinol modified-methylpolysiloxane. Preferably, the release accelerator is an amino modified-methylpolysiloxane.

The content of the release accelerator may, for example, be 0.01 part by mass to 3 parts by mass, preferably 0.05 part by mass to 2 parts by mass, and more preferably 0.1 part by mass to 1 part by mass relative to 100 parts by mass of the reactive functional group-containing fluoropolymer. These numerical ranges apply also to the content of the release accelerator in a cured product of the fluorine resin composition.

The thickness of the surface layer may, for example, be 1 μm to 10 μm, preferably 2 to 9 μm, and more preferably 3 μm to 8 μm.

The fluororesin composition may be produced by mixing and stirring the above-described components by means known by a person skilled in the art. For the mixing and stirring, for example, a mixer such as a high-speed mixer, a homomixer, and a paint shaker may be used. For the mixing and stirring, for example, a dissolver such as an edge-turbine high-speed dissolver may also be used.

A cured product of the fluororesin composition may be obtained as follows: the fluororesin composition is applied onto the surface of the base layer, and is heated, for example, at 100° C. to 200° C., preferably at 120° C. to 180° C., for example, for 10 seconds to 240 seconds, preferably for 30 seconds to 120 seconds. The cured product forms the surface layer. The application amount of the fluororesin composition may appropriately be set by a person skilled in the art depending on the thickness of a surface layer to be formed.

One surface layer of the two surface layers comes into contact with a mold in production of a molded article, and the other surface layer comes into contact with a molded article in production of the molded article. In the present description, a surface layer to come into contact with a mold is referred to as a mold-side surface layer, and a surface layer to come into contact with a molded article is referred to as a molded article-side surface layer. The composition of the mold-side surface layer may be the same as or different from the composition of the molded article-side surface layer.

The release accelerator is preferably contained in the fluororesin of the molded article-side surface layer. The release accelerator may be contained in the fluororesins of both the mold-side surface layer and the molded article-side surface layer.

In a preferred embodiment of the present technique, the mold-side surface layer comprises a cured product of a fluororesin composition containing the reactive functional group-containing fluoropolymer, the curing agent, and the particles, and the molded article-side surface layer comprises a cured product of a fluororesin composition containing the reactive functional group-containing fluoropolymer (particularly the hydroxy group-containing tetrafluoroethylene polymer), the curing agent, the particles, and the release accelerator.

More preferably, the mold-side surface layer comprises a cured product of a fluororesin composition containing a hydroxy group-containing tetrafluoroethylene polymer, an HDI polyisocyanate, and silicon dioxide particles, and the molded article-side surface layer comprises a cured product of a fluororesin composition containing a hydroxy group-containing tetrafluoroethylene polymer, an HDI polyisocyanate, silicon dioxide particles, and an amino modified-methylpolysiloxane.

Such two surface layers particularly contribute to making the release film of the present invention have excellent mold release properties.

[Features of Release Film]

According to a preferred embodiment of the present invention, the tensile breaking strength of the release film of the present invention may be 40 MPa to 200 MPa, more preferably 40 MPa to 120 MPa, even more preferably 40 MPa to 110 MPa, and particularly preferably 45 MPa to 100 MPa, as determined at 175° C. in accordance with JIS K7127, and the tensile elongation at break of the release film may be 200% to 500%, more preferably 250% to 450%, and even more preferably 300% to 400%, as determined at 175° C. in accordance with JIS K7127.

A tensile breaking strength and a tensile elongation at break each within the above numerical ranges contribute to making it possible to use the release film of the present invention in molding multiple times.

The gas ($O_2$) permeability of the release film of the present invention may, for example, be 5,000 to 50,000 cc/m$^2$·0.24 hr·atm, particularly 5,000 to 30,000 cc/m$^2$·0.24 hr·atm, and more particularly 5,000 to 20,000 cc/m$^2$·0.24 hr·atm or less, as determined at 175° C. in accordance with JIS K7126-1. The release film of the present invention has such a low gas permeability. Hence, when molding is performed with the release film of the present invention, mold contamination by gas generated from a resin can be suppressed.

The thickness of the release film of the present invention may, for example, be 30 μm to 100 μm, preferably 35 μm to 90 μm, and more preferably 40 to 80 μm. A thickness within the above numerical range makes the release film easily deformable along the shape of a mold.

[Applications of Release Film]

The release film of the present invention may be used, for example, in various molding processes and is particularly suitable for use in transfer molding or compression molding. The release film of the present invention may be used, for example, in transfer molding or compression molding while placed between a mold and a resin. The molding temperature during molding where the release film of the present invention is used may, for example, be 100° C. to 250° C. and preferably 120° C. to 200° C.

Figure 2:
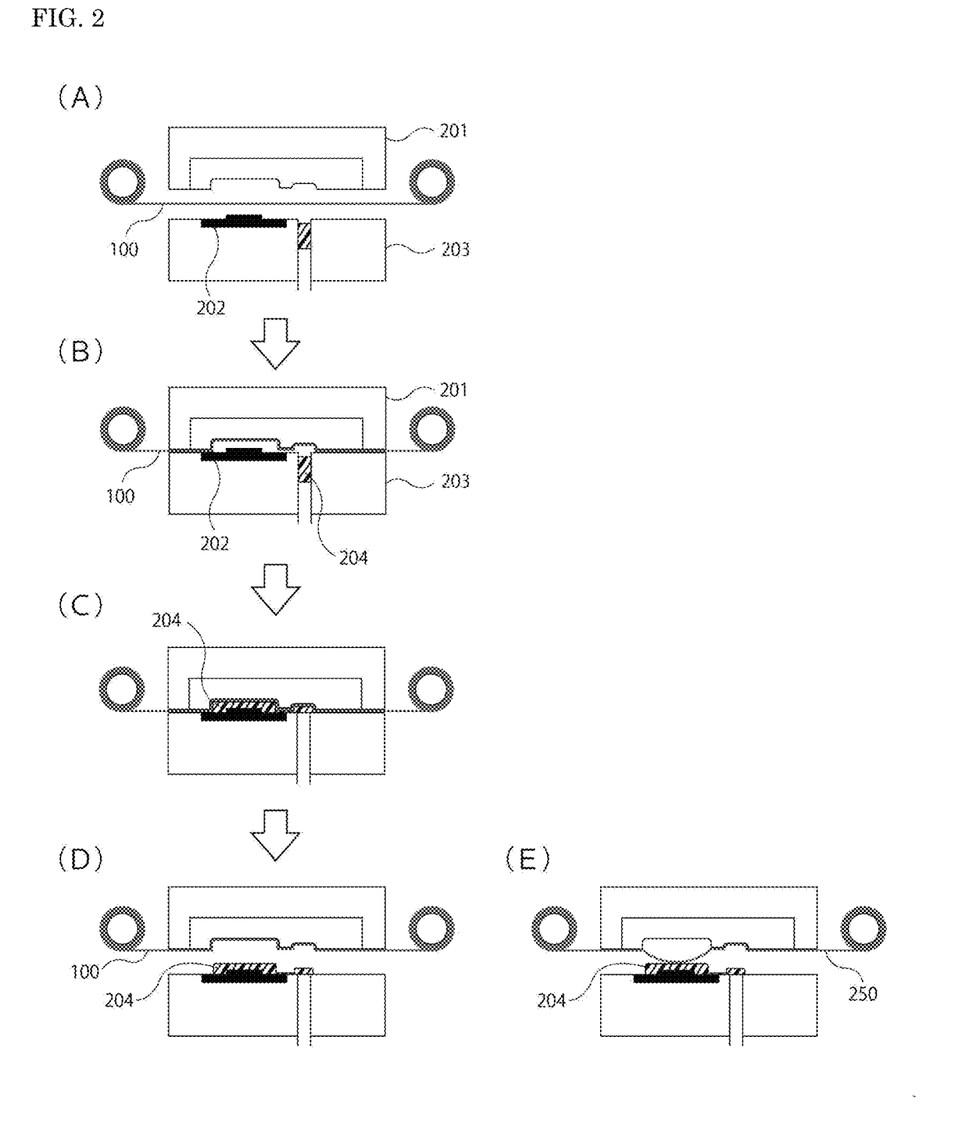
FIG. 2 are views showing an example usage of a release film of the present invention in transfer molding.

An example usage of the release film of the present invention in transfer molding will be described with reference to FIG. 2. As shown in FIG. 2A, a release film 100 of the present invention is placed between an upper mold 201 and a lower mold 203 with a semiconductor device-loaded substrate 202. Next, as shown in FIG. 2B, while the release film 100 is attached onto the inner face of the mold 201, the upper mold 201 is brought into contact with the substrate 202 and the lower mold 203. Next, as shown in FIG. 2C, a resin 204 is introduced between the upper mold 201 and the substrate 202, and then the resin 204 is cured. After curing, as shown in FIG. 2D, the upper mold 201 is removed from the substrate 202. The release film of the present invention has excellent mold release properties, and this allows the cured resin 204 to be smoothly released from the upper mold 201 in the step of FIG. 2D. If having insufficient mold release properties, a release film 250 might adhere to a cured resin 204, for example, as shown in FIG. 2E.

Figure 3:
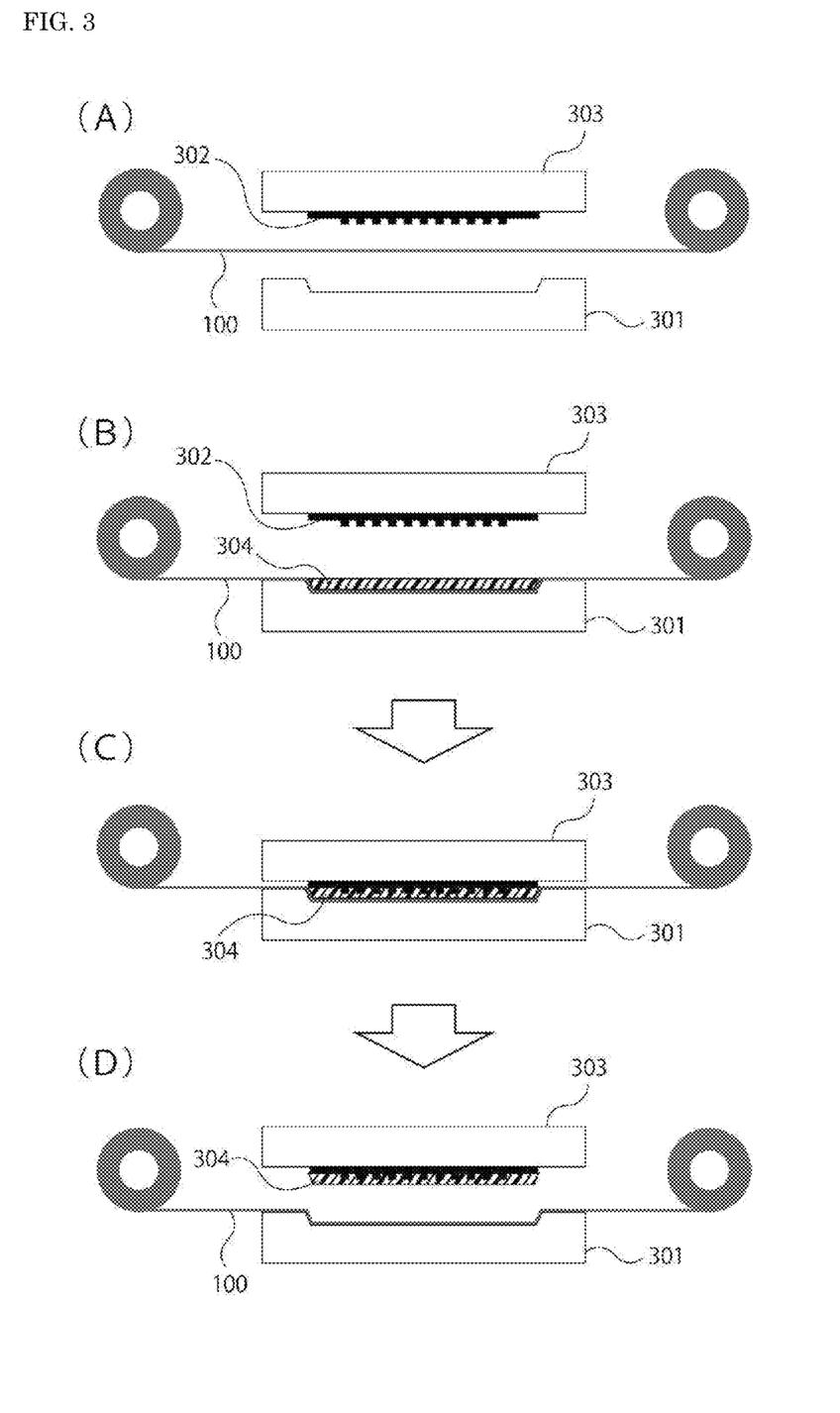
FIG. 3 are views showing an example usage of a release film of the present invention in compression molding.

An example usage of the release film of the present invention in compression molding will be described with reference to FIG. 3. As shown in FIG. 3A, a release film 100 of the present invention is placed between a lower mold 301 and an upper mold 303 with a semiconductor device-loaded substrate 302. Next, as shown in FIG. 3B, while the release film 100 is attached to the inner face of the lower mold 301, a resin 304 is placed in a hollow of the lower mold 301. As shown in FIG. 3C, the upper mold 303 is moved to be brought into contact with the lower mold 301. Then, the resin 304 is cured. After curing, as shown in FIG. 3D, the upper mold 303 is removed from the lower mold 301. The release film of the present invention has excellent mold release properties, and this allows the cured resin 304 to be smoothly released from the lower mold 301 in the step of FIG. 3D.

The release film of the present invention may be used for molding of various resins, and may be used, for example, for molding of an epoxy resin or a silicone resin. The type of a resin for forming a molded article may appropriately be selected by a person skilled in the art.

The release film of the present invention may be used for molding, for example, two or more times, preferably four or more times, more preferably five or more times, more preferably six or more times, and even more preferably eight or more times. The release film of the present invention may be used for molding, for example, 2 to 20 times, preferably 4 to 15 times, more preferably 5 to 15 times, more preferably 6 to 15 times, and even more preferably 8 to 12 times. Through multiple release operations, the release film of the present invention maintains its performance and is unlikely to break. Hence, the release film of the present invention can be used in multiple molding processes. This can reduce molding costs.

[Method of Manufacturing Release Film]

The present invention provides a method of manufacturing the release film described above.

According to an embodiment of the present invention, the manufacturing method comprises a first applying step of applying an acrylic resin composition or a siloxane resin composition onto one face of a base layer formed of a polyethylene terephthalate resin, a first curing step of curing the resin composition applied in the first applying step to give an oligomer bleeding prevention layer, after the first curing step, a second applying step of applying a fluororesin composition onto the oligomer bleeding prevention layer and the other face of the base layer, and after the second applying step, a second curing step of curing the fluororesin composition to give surface layers.

According to another embodiment of the present invention, the manufacturing method comprises a first applying step of applying an acrylic resin composition or a siloxane resin composition onto both faces of a base layer formed of a polyethylene terephthalate resin, a first curing step of curing the resin composition applied in the first applying step to give two oligomer bleeding prevention layers, after the first curing step, a second applying step of applying a fluororesin composition onto the two oligomer bleeding prevention layers, and after the second applying step, a second curing step of curing the fluororesin composition to give surface layers.

The above explanation applies also to the base layer, the oligomer bleeding layers, the acrylic resin composition and the siloxane resin composition for forming the oligomer bleeding layers, the surface layers, and the fluororesin composition for forming the surface layers used in the above manufacturing method, and the explanation thereof is omitted.

When an acrylic resin composition is used in the first applying step, the first curing step comprises heating the acrylic resin composition, for example, at 100 to 200° C., preferably at 120° C. to 180° C., for example, for 20 seconds to 5 minutes, preferably for 30 seconds to 2 minutes. By the heating, the acrylic resin composition is cured.

When a siloxane resin composition is used in the first applying step, the first curing step comprises heating the siloxane resin composition, for example, at 100 to 200° C., preferably at 120° C. to 180° C., for example, for 20 seconds to 5 minutes, preferably for 30 seconds to 2 minutes. By the heating, the siloxane resin composition is cured.

The second curing step comprises heating the fluororesin composition, for example, at 100° C. to 200° C., preferably at 120° C. to 180° C., for example, for 10 seconds to 240 seconds, preferably for 30 seconds to 120 seconds. By the heating, the fluororesin composition is cured.

The first and the second applying steps may appropriately be carried out by a person skilled in the art so as to achieve intended layer thicknesses.

The present invention will next be described in more detail with reference to examples. The examples described below are merely typical examples of the present invention, and the scope of the invention is not intended to be limited to these examples.

Example 1

As a base layer, a film formed of a polyethylene terephthalate resin (Tetoron G2CW, Teijin Ltd., a thickness of 38 μm) was prepared.

Next, as the main agent in an acrylic resin composition for forming an oligomer bleeding prevention layer, ARACOAT DA105 (Arakawa Chemical Industries, Ltd.) was prepared. As the curing agent contained in the acrylic resin composition, ARACOAT CL10211 (Arakawa Chemical Industries, Ltd.) was prepared. These agents were mixed to give an acrylic resin composition.

Next, two fluororesin compositions (hereinafter referred to as first fluororesin composition and second fluororesin composition) to form surface layers were prepared.

The first fluororesin composition was prepared by mixing and stirring 100 parts by mass of a hydroxy group-containing tetrafluoroethylene resin composition (Zeffle GK570, Daikin Industries, Ltd., containing 65% by mass of a hydroxy group-containing tetrafluoroethylene resin), 11.47 parts by mass of an amorphous silicon dioxide (Sylysia 380, Fuji Silysia Chemical Ltd.), 10 parts by mass of an isocyanurate-type polyisocyanate (a curing agent, Sumidur N3300, Sumitomo Bayer Urethane Co., Ltd.), 7.79 parts by mass of an adduct-type polyisocyanate (a curing agent, Duranate AE700-100), 6.18 parts by mass of butyl acetate, 44.62 parts by mass of ethyl acetate, and 89.25 parts by mass of MEK. The amorphous silicon dioxide had an average particle size (volume average diameter as described above) of 8.8 μm as determined with a particle size analyser (SALD-2200, Shimadzu Corporation) by laser diffraction particle size analysis.

The second fluororesin composition was the same as the first fluororesin composition except that 0.31 part by mass of an amino modified-methylpolysiloxane (a release accelerator, Shin-Etsu Chemical) was further added to the first fluororesin composition.

Onto one face of the base layer, the acrylic resin composition was applied. After the application, the acrylic resin composition was cured by heating at 120° C. for 1 minute, giving an oligomer bleeding prevention layer formed of an acrylic resin. After the curing, the first fluororesin composition was applied onto the oligomer bleeding prevention layer, and the second fluororesin composition was applied onto the other face of the base layer. After the application, these compositions were cured by heating at 150° C. for 60 seconds, giving a release film comprising a coating layer between the base layer and the surface layer (hereinafter referred to as "release film of Example 1").

The release film of Example 1 had a thickness of 60±5 μm. The base layer in the release film of Example 1 had a thickness of 38 μm±10%. Of the two surface layers in the release film of Example 1, the surface layer of a cured product of the first fluororesin composition had a thickness of 5.5±0.5 μm. The surface layer of a cured product of the second fluororesin composition had a thickness of 5.5±0.5 μm. The oligomer bleeding prevention layer had a thickness of 1 μm.

The cured product of the first fluororesin composition contained 17.65 parts by mass of the amorphous silicon dioxide, 15.39 parts by mass of the isocyanurate-type polyisocyanate, and 11.98 parts by mass of the adduct-type polyisocyanate relative to 100 parts by mass of the hydroxy group-containing tetrafluoroethylene resin.

The cured product of the second fluororesin composition contained 17.65 parts by mass of the amorphous silicon dioxide, 15.39 parts by mass of the isocyanurate-type polyisocyanate, 11.98 parts by mass of the adduct-type polyisocyanate, and 0.48 part by mass of the amino mothfied-methylpolysiloxane relative to 100 parts by mass of the hydroxy group-containing tetrafluoroethylene resin.

The release film of Example 1 had a tensile breaking strength of 140 MPa as determined at 175° C. in accordance with JIS K7127. The release film had a tensile elongation at break of 350% as determined at 175° C. in accordance with JIS K7127.

Comparative Example 1

As a base layer, a film formed of a polyethylene terephthalate resin (Tetoron G2CW, Teijin Ltd., a thickness of 38 μm, a glass transition temperature of 100° C.) was prepared.

Onto one face of the film, the first fluororesin composition according to Example 1 was applied, and onto the other face of the film, the second fluororesin composition according to Example 1 was applied. After the application, these compositions were cured by heating at 150° C. for 60 seconds, giving a release film in which fluororesin layers were laminated on the corresponding faces of the PET resin film (hereinafter referred to as "release film of Comparative Example 1").

The release film of Comparative Example 1 had a thickness of 60±5 μm. The base layer in the release film of Comparative Example 1 had a thickness of 38 μm±10%. Of the two surface layers in the release film of Comparative Example 1, the surface layer of a cured product of the first fluororesin composition had a thickness of 5.5±0.5 μm. The surface layer of a cured product of the second fluororesin composition had a thickness of ±0.5 μm.

The cured product of the first fluororesin composition contained 17.65 parts by mass of the amorphous silicon dioxide, 15.39 parts by mass of the isocyanurate-type polyisocyanate, and 11.98 parts by mass of the adduct-type polyisocyanate relative to 100 parts by mass of the hydroxy group-containing tetrafluoroethylene resin.

The cured product of the second fluororesin composition contained 17.65 parts by mass of the amorphous silicon dioxide, 15.39 parts by mass of the isocyanurate-type polyisocyanate, 11.98 parts by mass of the adduct-type polyisocyanate, and 0.48 part by mass of the amino mothfied-methylpolysiloxane relative to 100 parts by mass of the hydroxy group-containing tetrafluoroethylene resin.

The release film of Comparative Example 1 had a tensile breaking strength of 140 MPa as determined at 175° C. in accordance with JIS K7127. The release film had a tensile elongation at break of 350% as determined at 175° C. in accordance with JIS K7127.

(Mold Contamination by Release Film)

The release film of Comparative Example 1 was used to perform molding of an epoxy resin by transfer molding. The molding was performed as shown in FIG. 3. The molding was performed such that the layer of the cured product of the first fluororesin composition was brought into contact with a mold, and the layer of the cured product of the second fluororesin composition was brought into contact with the epoxy resin. Next, the release film used in the above molding was used to perform the same molding once again. The same release film was used for the same molding twice more, and the molding was performed four times in total with the single release film.

Figure 4:
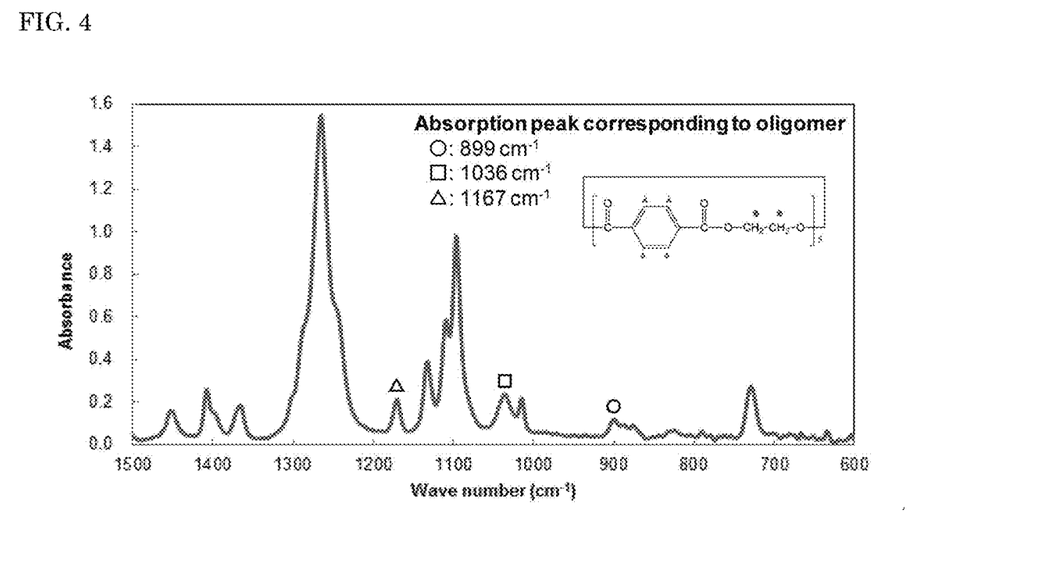
FIG. 4 is a view showing an FT-IR spectrum.

After the fourth molding, white substance adhesion was observed on the mold. The white substance was analyzed with a Fourier transformation infrared spectrometer (IRT-5000 FT-IR microspectrometer, JASCO Corporation). As a result, an FT-IR spectrum as shown in FIG. 4 was obtained. The FT-IR spectrum revealed that the white substance was an oligomer of ethylene terephthalate (mainly a cyclic trimer). In other words, it was revealed that an oligomer contained in the base layer formed of the PET resin passed through the surface layer of the cured product of the fluororesin composition and contaminated the mold. It was also revealed that the cured product was insufficient to prevent the oligomer from moving to a mold and a molded article.

Figure 5:
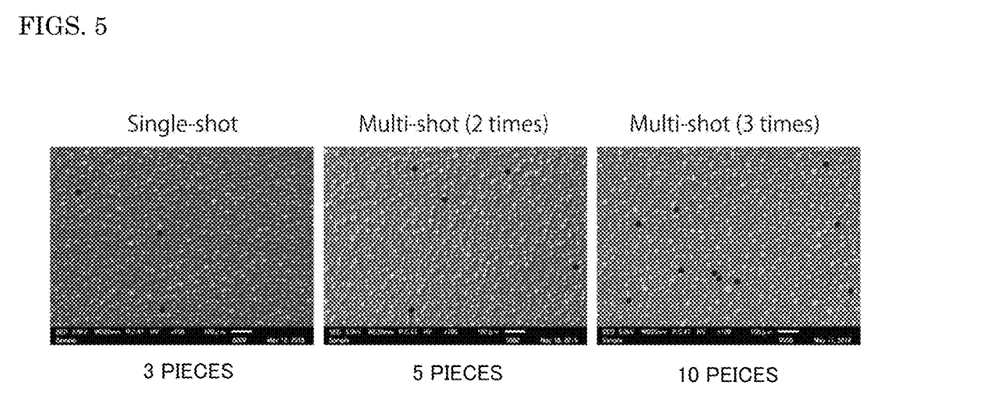
FIG. 5 are each an electron micrograph of a mold-side surface of a release film after molding.

Of the molding four times, after the first, the second, and the third molding, the mold-side surface of the release film was observed under a scanning electron microscope (JSM-IT100 SEM, JEOL Ltd.). The observation results are shown in FIG. 5. FIG. 5 are each an electron micrograph of a 1.2 mm×0.8 mm region in the release film. As shown in the left micrograph in FIG. 5, the oligomer was precipitated at three sites after the first molding. As shown in the center micrograph in FIG. 5, the oligomer was precipitated at five sites after the second molding, and as shown in the right micrograph in FIG. 5, the oligomer was precipitated at ten sites after the third molding. Hence, it has been revealed that as the number of molding times increases, a larger amount of the cyclic trimer moves to a mold and a molded article.

Figure 6:
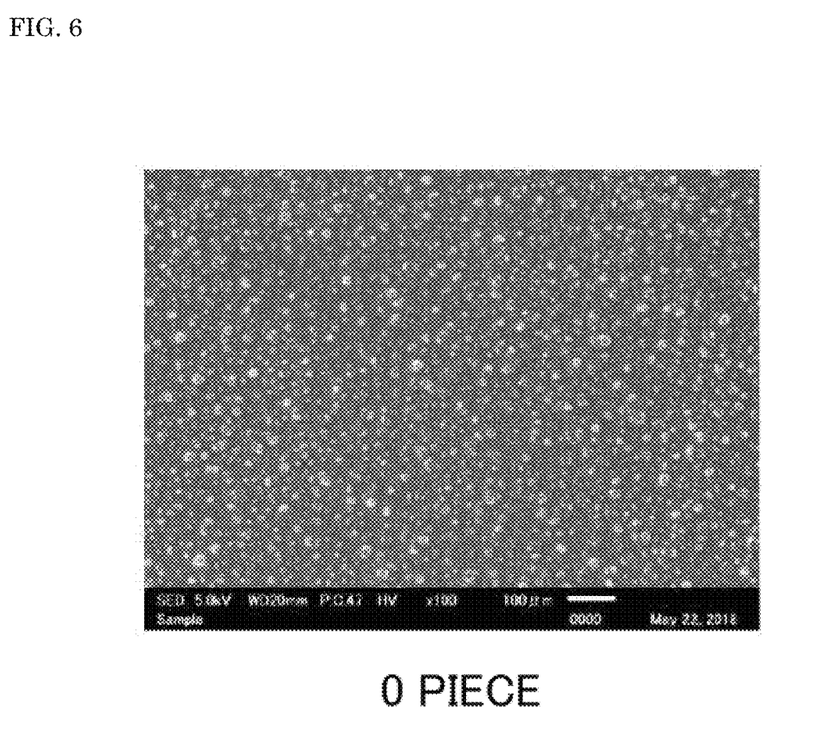
FIG. 6 is an electron micrograph of a mold-side surface of a release film after molding.

The release film of Example 1 was used to perform molding of an epoxy resin four times by transfer molding in the same manner as that in Comparative Example 1. After the fourth molding, the mold-side surface of the release film was observed under a scanning electron microscope (JSM-IT100 SEM, JEOL Ltd.). The observation result is shown in FIG. 6. FIG. 6 is an electron micrograph of a 1.2 mm×0.8 mm region in the release film. As shown in FIG. 6, no oligomer precipitation was observed even after the fourth molding. Hence, by using the film formed of an easily moldable PET resin as the base layer, the oligomer can be prevented from moving to a mold and a molded article.

Figure 7:
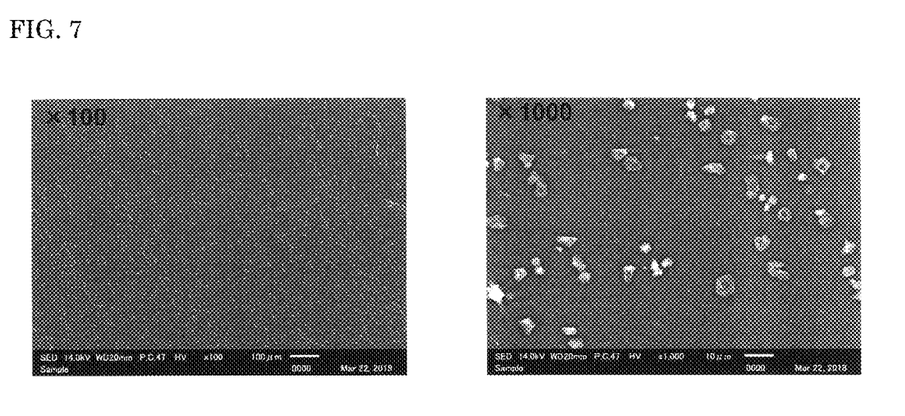
FIG. 7 are each a micrograph of a surface of a release film after heating.
Figure 8:
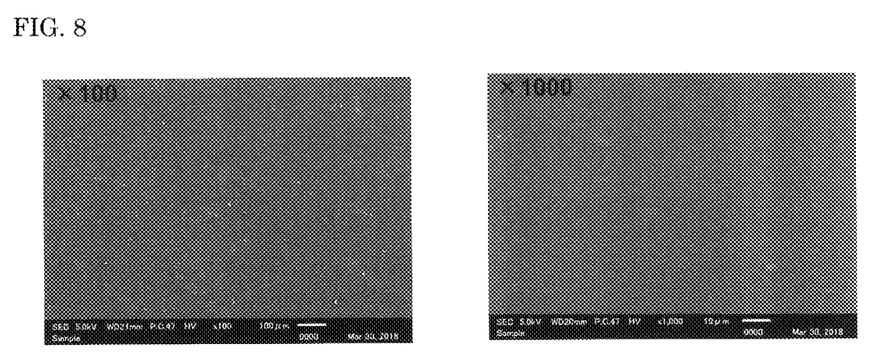
FIG. 8 are each a micrograph of a surface of a release film after heating.

Whether oligomer precipitation was observed or not was examined when only the release film of Example 1 or Comparative Example 1 was heated. For the examination, the release film of Example 1 or Comparative Example 1 was interposed between SUS (Steel Use Stainless) plates and was heated on a hot plate at 175° C. for 30 minutes. Each surface of the release films of Example 1 and Comparative Example 1 before or after heating was observed under a microscope. Micrographs of Comparative Example 1 are shown in FIG. 7. The left micrograph in FIG. 7 was at a 100-fold magnification, and the right micrograph in FIG. 7 was at a 1,000-fold magnification. These micrographs revealed that the oligomer was precipitated after heating. Micrographs of Example 1 are shown in FIG. 8. The left micrograph in FIG. 8 was at a 100-fold magnification, and the right micrograph in FIG. 8 was at a 1,000-fold magnification. These micrographs revealed that no oligomer precipitation was observed after heating the release film of Example 1.

The molded article of an epoxy resin was smoothly released from the release film of Example 1 after each of the first molding to the fourth molding. This has revealed that the release film of Example 1 has excellent mold release properties and that the mold release properties are maintained through multiple molding operations.

(Suitability of Release Film for Multi-Shot Molding)

As described in the above "Mold contamination by release film", the release film of Example 1 was able to be used in continuous molding at least four times. In other words, the release film of Example 1 has excellent suitability for multi-shot molding.

The molding described in the above "Mold contamination by release film" was further performed multiple times, and the release film of Example 1 was broken in the tenth molding. The release film of Comparative Example 1 was also broken in the tenth molding.

The tensile breaking strength and the tensile elongation at break of the release film of Example 1 were 140 MPa and 350%, respectively, as described above. These tensile breaking strength and tensile elongation at break are thought to contribute to suitability for multi-shot molding.

Two commercially available release films were prepared. The tensile breaking strength and the tensile elongation at break of the first release film were 7 MPa and 550 MPa, respectively, as determined by the above measurement method. The tensile breaking strength and the tensile elongation at break of the second release film were 26 MPa and 130 MPa, respectively, as determined by the above measurement method. These two release films were used to perform molding multiple times in the same manner as the above. As a result, the first release film was broken in the third molding. The second release film was broken in the second molding.

The results of the suitability for multi-shot molding of the release films of Example 1 and Comparative Example 1 and the commercially available release films (hereinafter referred to as commercially available release films 1 and 2) as well as the tensile breaking strength and the tensile elongation at break of these films reveal that a release film having a tensile breaking strength and a tensile elongation at break each within a particular numerical range (for example, 40 MPa to 200 MPa and 200% to 500%) can be used for molding more times.

For easy comparison of the above results of the release films of Example 1 and Comparative Example 1 and the commercially available release films 1 and 2, these results are shown in Table 1.

In Table 1, the evaluation criteria for suitability for multi-shot molding are as follows:
AA: A film was not broken after molding five or more times.
A: A film was not broken after molding three or more times.
B: A film was broken in the third molding.
C: A film was broken in the second molding.

[Table 1]

TABLE 1

|  | Example 1 | Comparative Example 1 |
|---|---|---|
| Tensile breaking strength (MPa) | 140 | 140 |
| Tensile elongation at break (%) | 350 | 350 |
| Oligomer precipitation | not observed | observed |
| Suitability for multi-shot molding | AA | AA |

|  | Commercially available release film 1 | Commercially available release film 2 |
|---|---|---|
| Tensile breaking strength (MPa) | 7 | 26 |
| Tensile elongation at break (%) | 550 | 130 |
| Suitability for multi-shot molding | B | C |

(Gas Permeability)

The gas permeability of the release film of Example 1 was determined at 175° C. in accordance with JIS K7126-1. The result was cc/m²·0.24 hr·atm. The gas permeabilities of the commercially available release films 1 and 2 were also determined by substantially the same method. As a result, the gas permeabilities of the commercially available release films 1 and 2 were 142,000 and 130,000 cc/m²·0.24 hr·atm, respectively. This reveals that the release film of Example 1 also has excellent gas permeability.

REFERENCE SIGNS LIST 100A, 100B release film
101 base layer
102, 103 surface layer
104, 105 oligomer bleeding prevention layer

The invention claimed is:

1. A release film for use in sealing a semiconductor with a resin comprising:
an oligomer bleeding prevention layer formed of an acrylic resin or a siloxane resin and laminated on a first face of a base layer that is formed of a polyethylene terephthalate resin;
a surface layer formed of a fluororesin and laminated on the oligomer bleeding prevention layer; and
a surface layer formed of a fluororesin and laminated on a second face of the base layer, or
an oligomer bleeding prevention layer formed of an acrylic resin or a siloxane resin and laminated on a second face of the base layer, and a surface layer formed of a fluororesin and laminated on the oligomer bleeding prevention layer that is laminated on the second face,
wherein the fluororesin that forms the surface layers is a cured product of a fluororesin composition containing a reactive functional group-containing fluoropolymer and a curing agent, the reactive functional group-containing fluoropolymer is a hydroxy group-containing tetrafluoroethylene polymer, and the curing agent is an isocyanate curing agent,
the fluororesin that forms the surface layer on at least one face of the base layer comprises particles having an average particle size of 1 μm to 10 μm determined by laser diffraction particle size analysis,
the content of the curing agent in the fluororesin composition is 15 parts by mass to 50 parts by mass relative to 100 parts by mass of the reactive functional group-containing fluoropolymer, and the content of the particles in the fluororesin composition is 10 parts by mass to 30 parts by mass relative to 100 parts by mass of the reactive functional group-containing fluoropolymer.

2. The release film according to claim 1, wherein the oligomer bleeding prevention layer on the first face is formed of an acrylic resin.

3. The release film according to claim 1, wherein the release film has a tensile breaking strength of 40 MPa to 200 MPa as determined at 175° C. in accordance with JIS K7127, and the release film has a tensile elongation at break of 200% to 500% as determined at 175° C. in accordance with JIS K7127.

4. The release film according to claim 1, wherein the release film has an oxygen gas permeability of 5,000 to 50,000 cc/m$^2$·0.24 hr·atm as determined at 175° C. in accordance with JIS K7126-1.

5. The release film according to claim 1, wherein the base layer has a tensile breaking strength of 40 MPa to 200 MPa as determined at 175° C. in accordance with JIS K7127.

6. The release film according to claim 1, wherein the base layer has a tensile elongation at break of 200% to 500% as determined at 175° C. in accordance with JIS K7127.

7. The release film according to claim 1, used for transfer molding or compression molding.

8. The release film according to claim 1, used for molding two or more times.

9. A method of manufacturing a release film for use in sealing a semiconductor with a resin, the method comprising:

a first applying step of applying an acrylic resin composition or a siloxane resin composition onto one face of a base layer formed of a polyethylene terephthalate resin;

a first curing step of curing the resin composition applied in the first applying step to give an oligomer bleeding prevention layer;

after the first curing step, a second applying step of applying a fluororesin composition onto the oligomer bleeding prevention layer and an other face of the base layer; and after the second applying step, a second curing step of curing the fluororesin composition to give surface layers, wherein a fluororesin that forms the surface layers in the second applying step is a cured product of the fluororesin composition, the fluororesin composition contains a reactive functional group-containing fluoropolymer and a curing agent, the reactive functional group-containing fluoropolymer is a hydroxy group-containing tetrafluoroethylene polymer, and the curing agent is an isocyanate curing agent, the fluororesin that forms at least one of the surface layers comprises particles having an average particle size of 1 μm to 10 μm determined by laser diffraction particle size analysis, the content of the curing agent in the fluororesin composition is 15 parts by mass to 50 parts by mass relative to 100 parts by mass of the reactive functional group-containing fluoropolymer, and the content of the particles in the fluororesin composition is 10 parts by mass to 30 parts by mass relative to 100 parts by mass of the reactive functional group-containing fluoropolymer.

10. A method of manufacturing a release film for use in sealing a semiconductor with a resin, the method comprising:

a first applying step of applying an acrylic resin composition or a siloxane resin composition onto both faces of a base layer formed of a polyethylene terephthalate resin;

a first curing step of curing the resin composition applied in the first applying step to give two oligomer bleeding prevention layers;

after the first curing step, a second applying step of applying a fluororesin composition onto the two oligomer bleeding prevention layers; and after the second applying step, a second curing step of curing the fluororesin composition to give surface layers, wherein a fluororesin that forms the surface layers in the second applying step is a cured product of the fluororesin composition, the fluororesin composition contains a reactive functional group-containing fluoropolymer and a curing agent, the reactive functional group-containing fluoropolymer is a hydroxy group-containing tetrafluoroethylene polymer, and the curing agent is an isocyanate curing agent, the fluororesin that forms at least one of the surface layers comprises particles having an average particle size of 1 μm to 10 μm determined by laser diffraction particle size analysis, the content of the curing agent in the fluororesin composition is 15 parts by mass to 50 parts by mass relative to 100 parts by mass of the reactive functional group-containing fluoropolymer, and the content of the particles in the fluororesin composition is 10 parts by mass to 30 parts by mass relative to 100 parts by mass of the reactive functional group-containing fluoropolymer.

\* \* \* \* \*